United States Patent
Ku et al.

(10) Patent No.: US 12,018,990 B2
(45) Date of Patent: Jun. 25, 2024

(54) LIGHT-BASED TACTILE SENSING WITH DIRECTIONAL SENSITIVITY

(71) Applicant: The Regents of the University of Michigan, Ann Arbor, MI (US)

(72) Inventors: Pei-Cheng Ku, Ann Arbor, MI (US); Jingyang Sui, Atlanta, GA (US); Kunook Chung, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 435 days.

(21) Appl. No.: 17/425,205

(22) PCT Filed: Jan. 22, 2020

(86) PCT No.: PCT/US2020/014597
§ 371 (c)(1),
(2) Date: Jul. 22, 2021

(87) PCT Pub. No.: WO2020/154393
PCT Pub. Date: Jul. 30, 2020

(65) Prior Publication Data
US 2022/0082459 A1    Mar. 17, 2022

Related U.S. Application Data

(60) Provisional application No. 62/796,516, filed on Jan. 24, 2019.

(51) Int. Cl.
*G01L 1/24* (2006.01)
*B81B 3/00* (2006.01)
(Continued)

(52) U.S. Cl.
CPC .............. *G01L 1/24* (2013.01); *B81B 3/0029* (2013.01); *G01L 1/25* (2013.01); *G01L 5/226* (2013.01);
(Continued)

(58) Field of Classification Search
CPC ... G01L 1/24; G01L 1/247; G01L 1/25; G01L 5/226; G01L 5/228; B81B 3/0029; B81B 2201/0264; H01L 25/0753; H01L 33/20
See application file for complete search history.

(56) References Cited

U.S. PATENT DOCUMENTS

| 9,700,258 B2 | 7/2017 | Jiang |
| 2015/0200612 A1 | 7/2015 | Matsukawa et al. |

(Continued)

FOREIGN PATENT DOCUMENTS

| KR | 100399679 B1 | 9/2003 |
| KR | 101353013 B1 | 1/2014 |
| KR | 101902043 B1 | 9/2018 |

OTHER PUBLICATIONS

Extended European Search Report from European Patent Application No. 20 744 305.2, dated Nov. 2, 2022, 4 pages.
(Continued)

*Primary Examiner* — Benjamin R Schmitt
(74) *Attorney, Agent, or Firm* — Lempia Summerfield Katz LLC

(57) ABSTRACT

A device includes a substrate and a set of force sensors supported by the substrate. Each force sensor includes a pillar extending outward from the substrate, each pillar comprising a stack of semiconductor layers, the stack of semiconductor layers being configured to emit light upon biasing of the stack of semiconductor layers, and post disposed along only a portion of a perimeter of the pillar such that, taken together, the pillar and the post have an asymmetrical cross-sectional shape. Each pillar has a cross-section elongated along an axis. An orientation of the axis, and a peripheral position of the portion of the perimeter at which the post is disposed, differ across the set of force sensors such that a variation in light emitted by the stack of
(Continued)

semiconductor layers of one or more of the force sensors is indicative of a direction of a shear force applied to the set of force sensors.

16 Claims, 8 Drawing Sheets

(51) Int. Cl.
  *G01L 1/25* (2006.01)
  *G01L 5/22* (2006.01)
  *H01L 25/075* (2006.01)
  *H01L 33/20* (2010.01)

(52) U.S. Cl.
  CPC .......... *H01L 25/0753* (2013.01); *H01L 33/20* (2013.01); *B81B 2201/0264* (2013.01); *B81B 2203/0118* (2013.01)

(56) References Cited

U.S. PATENT DOCUMENTS

| | | | |
|---|---|---|---|
| 2017/0235387 A1* | 8/2017 | Sacha | G06F 3/0445 345/174 |
| 2018/0332677 A1 | 11/2018 | Ku et al. | |

OTHER PUBLICATIONS

Chung et al., "Monolithic integration of individually addressable light-emitting diode color pixels", Appl. Phys. Lett. 110, Mar. 2017, 13 pages.
International Preliminary Report on Patentability in International Patent Application No. PCT/US2020/014597, dated Aug. 5, 2021, 6 pages.
International Search Report and Written Opinion of the International Searching Authority in International Patent Application No. PCT/US2020/014597, dated May 14, 2020, 9 pages.
Sui et al., "Gallium Nitride Based Tactile Sensors", Conference on Lasers and Electro-Optics, OSA Technical Digest (online) (Optical Society of America, 2017), 2 pages.
Teng et al., "Elliptical quantum dots as on-demand single photons sources with deterministic polarization states", Appl. Phys. Lett. 107, Nov. 2015, 6 pages.
Zhang et al., "Site-controlled InGaN/GaN single-photon-emitting diode", Appl. Phys. Lett. 108, Apr. 2016, 15 pages.
A. Chortos, J. Liu, and Z. Bao; Pursuing prosthetic electronic skin; Nature materials, vol. 15, 2016; pp. 937-950.
C. Pan, L. Dong, G. Zhu, S. Niu, R. Yu, Q. Yang, Y. Liu, and Z. L. Wang; High-resolution electroluminescent imaging of pressure distribution using a piezoelectric nanowire LED array; Nature Photonics, vol. 7, No. 9, 2013; 7 pp.
C. W. Ma, L. S. Hsu, J. C. Kuo, and Y. J. Yang; A flexible tactile and shear sensing array fabricated using a novel buckypaper patterning technique; Sensors and Actuators A: Physical, vol. 231, 2015; 7 pp.
D. M. Vogt, Y.-L. Park, and R. J. Wood; Design and characterization of a soft multi-axis force sensor using embedded microfluidic channels; IEEE Sensors Journal, vol. 13, No. 10, pp. 4056-4064, 2013.
E. S. Hwang and Y. J. Kim; A polymer-based flexible tactile sensor and its application to robotics; Proceedings of IEEE Sensors, 2007, pp. 784-787.
F. Zhu and J. W. Spronck; A capacitive tactile sensor for shear and normal force measurements; Sensors and Actuators A: Physical, vol. 31, No. 1-3, pp. 115-120, 1992.
H. Kawasaki, T. Komatsu, and K. Uchiyama; Dexterous Anthropomorphic Robot Hand With Distributed Tactile Sensor: Gifu Hand II; IEEE/ASME Transactions on Mechatronics, vol. 7, No. 3, pp. 296-303, 2002.
H. Takahashi, A. Nakai, N. Thanh-Vinh, K. Matsumoto, and I. Shimoyama; A triaxial tactile sensor without crosstalk using pairs of piezoresistive beams with sidewall doping; Sensors and Actuators, A: Physical, vol. 199, pp. 43-48, 2013.
H.-K. Lee, J. Chung, S.-I. Chang, and E. Yoon; Normal and Shear Force Measurement Using a Flexible Polymer Tactile Sensor With Embedded Multiple Capacitors; Journal of Microelectromechanical Systems, vol. 17, No. 4, pp. 934-942, 2008.
J. Park et al.; Tactile-direction-sensitive and stretchable electronic skins based on human-skin-inspired interlocked microstructures; ACS Nano, vol. 8, No. 12, 2014; 31 pp.
L. Zhang, L. K. Lee, C.-H. Teng, T. Hill, P.-C. Ku, and H. Deng; How much better are InGaN/GaN nanodisks than quantum wells—oscillator strength enhancement and changes in optical properties; Applied Physics Letters, vol. 104, No. 5, 2014; 6 pp.
M. H. Lee and H. R. Nicholls; Tactile sensing for mechatronics—a state of the art survey; Mechatronics, vol. 9, No. 1, pp. 1-31, 1999.
M. Ohka, Y. Mitsuya, Y. Matsunaga, and S. Takeuchi; Sensing characteristics of an optical three-axis tactile sensor under combined loading; Robotica, vol. 22, No. 2, pp. 213-221, 2004.
M. Shimojo, A. Namiki, M. Ishikawa, R. Makino, and K. Mabuchi; A tactile sensor sheet using pressure conductive rubber with electrical-wires stitched method; IEEE Sensors Journal, vol. 4, No. 5, pp. 589-596, 2004.
N. Jamond et al.; Piezo-generator integrating a vertical array of GaN nanowires; Nanotechnology, vol. 27, No. 32, 2016; 9 pp.
R. S. Dahiya, G. Metta, M. Valle, and G. Sandini; Tactile Sensing—From Humans to Humanoids; IEEE Transactions on Robotics, vol. 26, No. 1, pp. 1-20, 2010.
S. Asano et al.; Surface-mountable capacitive tactile sensors with flipped CMOS-diaphragm on a flexible and stretchable bus line; Sensors and Actuators A: Physical, vol. 240, pp. 167-176, 2016.
T. Zhang, H. Liu, L. Jiang, S. Fan, and J. Yang; Development of a flexible 3-D tactile sensor system for anthropomorphic artificial hand; IEEE Sensors Journal, vol. 13, No. 2, pp. 510-518, 2013.
Teng et al., Strain-induced red-green-blue wavelength tuning in InGaN quantum wells; Appl. Phys. Lett., vol. 108, 2016; 4 pp.
Y. Jung, D. G. Lee, J. Park, H. Ko, and H. Lim; Piezoresistive tactile sensor discriminating multidirectional forces; Sensors, vol. 15, No. 10, pp. 25463-25473, 2015.

* cited by examiner

LIGHT-BASED TACTILE SENSING WITH DIRECTIONAL SENSITIVITY

CROSS-REFERENCE TO RELATED APPLICATION

This U.S. National Phase application is based on International Application No. PCT/US2020/014597, filed Jan. 22, 2020, which claims the benefit of U.S. provisional application entitled "Light-Based Tactile Sensing with Directional Sensitivity," filed Jan. 24, 2019, and assigned Ser. No. 62/796,516, the entire disclosures of which are hereby expressly incorporated by reference. Priority benefit of these earlier filed applications is hereby claimed.

STATEMENT REGARDING FEDERALLY SPONSORED RESEARCH OR DEVELOPMENT

This invention was made with government support under Contract No. DMR 1409529 awarded by the National Science Foundation. The government has certain rights in the invention.

BACKGROUND OF THE DISCLOSURE

Field of the Disclosure

The disclosure relates generally to tactile sensors.

Brief Description of Related Technology

Tactile sensing has been used for artificial prosthetics and robotics applications. Tactile sensing attempts to detect both the amplitude and direction of forces when interacting with an object. Detecting both amplitude and direction is useful for perception of surface textures and delicate maneuvering actions such as gripping. Past devices have discriminated the direction of the stress, including differentiating between normal and shear stress and between different shear stress directions, via detection of resistance or capacitance changes in response to the external force due to structural deformation or via the piezoresistive as well as piezoelectric effects. To detect the direction, each sensor pixel includes multiple sensing elements which respond to forces in different directions. However, measuring and mapping out the change of resistance in a large resistor network can be difficult to scale up without sacrificing the spatial resolution or requiring stringent control on the uniformity. Similar challenges are presented by sensors utilizing capacitive effects.

Optical approaches have also been proposed. An optical pressure sensor used light-emitting piezoelectric zinc-oxide (ZnO) nanowire nanostructures, the light emission intensities of which were sensitive to external pressure. A change in emission was detected using an off-the-shelf imager (e.g., a silicon complementary metal oxide semiconductor (CMOS) sensor). Because only a common bias is used for the entire array of light-emitting structures, high spatial resolution is achieved. While providing scalability, the ZnO nanowire pressure sensor unfortunately cannot discriminate the direction of the force. The pressure sensor also exhibited undesirably low sensitivity in the ultraviolet wavelength range.

Other piezoelectric materials have been used as optical tactile sensors, such as Gallium nitride (GaN) and related alloys. The emission wavelength of GaN can be tuned to the visible range for compatibility with off-the-shelf silicon imagers.

SUMMARY OF THE DISCLOSURE

In accordance with one aspect of the disclosure, a device includes a substrate and a set of force sensors supported by the substrate. Each force sensor of the set of force sensors includes a pillar extending outward from the substrate. Each pillar includes a stack of semiconductor layers, the stack of semiconductor layers being configured to emit light upon biasing of the stack of semiconductor layers, and a post disposed along only a portion of a perimeter of the pillar such that, taken together, the pillar and the post have an asymmetrical cross-sectional shape. Each pillar has a cross-section elongated along an axis. An orientation of the axis, and a peripheral position of the portion of the perimeter at which the post is disposed, differ across the set of force sensors such that a variation in light emitted by the stack of semiconductor layers of one or more of the force sensors of the set of force sensors is indicative of a direction of a shear force applied to the set of force sensors.

In accordance with another aspect of the disclosure, a tactile sensor device includes a substrate and a pixelated array of force sensors supported by the substrate and including a plurality of pixels. Each pixel of the plurality of pixels includes a respective set of force sensors. Each force sensor of the set of force sensors includes a pillar extending outward from the substrate. Each pillar includes a stack of semiconductor layers, the stack of semiconductor layers being configured to emit light upon application of a bias voltage across the stack of semiconductor layers. Each force sensor further includes an electrode disposed along the pillar to apply the bias voltage. Each pillar has a cross-section elongated along an axis. Each respective set of force sensors includes first and second pairs of sensors having the axis oriented along first and second directions, respectively, the first and second directions being different from one another. For each pair of the first and second pairs of sensors, the electrode is disposed on different peripheral sections of the pillar.

In connection with any one of the aforementioned aspects, the devices described herein may alternatively or additionally include any combination of one or more of the following aspects or features. The post is configured as an electrode to apply a bias voltage across the stack of semiconductor layers. The electrode is electrically connected to the stack of semiconductor layers at an outer end of the stack. The pillar includes a p-type region to which the electrode is electrically connected. Each force sensor further includes a dielectric shell disposed between the stack of semiconductor layers and the electrode. The orientation of the axis varies between one of two orthogonal directions. The peripheral position varies between one of four discrete peripheral positions. The cross-section has an elliptical shape, such that the axis is a major axis of the elliptical shape. The peripheral position varies between one of four discrete peripheral positions, each peripheral position being disposed along a respective quadrant of the elliptical shape. Each force sensor of the set of force sensors includes a platform spaced from the substrate and supported by the pillar and the post. Each stack of semiconductor layers includes a GaN-based heterostructure. The substrate includes an imager, the imager including a plurality of light detectors disposed relative to the set of force sensors to receive the light emitted from the set of force sensors. The device further includes an array of force sensors supported by the substrate, the array including a plurality of force sensor sets. The set of force sensors corresponds with a respective set of the plurality of force sensor sets. Each force sensor set of the plurality of force sensor sets forms a pixel of the array of force sensors. The variation in the light includes an emission intensity variation indicative of the direction of the shear force. The emission intensity variation is an intensity decrease as the shear force increases. A common bias is applied to each force sensor of the set of force sensors. The first and second directions are orthogonal to one another. Each of the different peripheral sections is disposed along a respective quadrant of a circumference of the pillar. The cross-section has an elliptical shape, such that the axis is a major axis of the elliptical shape. An intensity of light emitted by the stack of semiconductor layers decreases when a shear force is applied in a direction along the axis. A decrease in the intensity is maximized when the direction in which the shear force is applied is attempting to move the pillar toward the electrode.

BRIEF DESCRIPTION OF THE DRAWING FIGURES

For a more complete understanding of the disclosure, reference should be made to the following detailed description and accompanying drawing figures, in which like reference numerals identify like elements in the figures.

Figure 6:
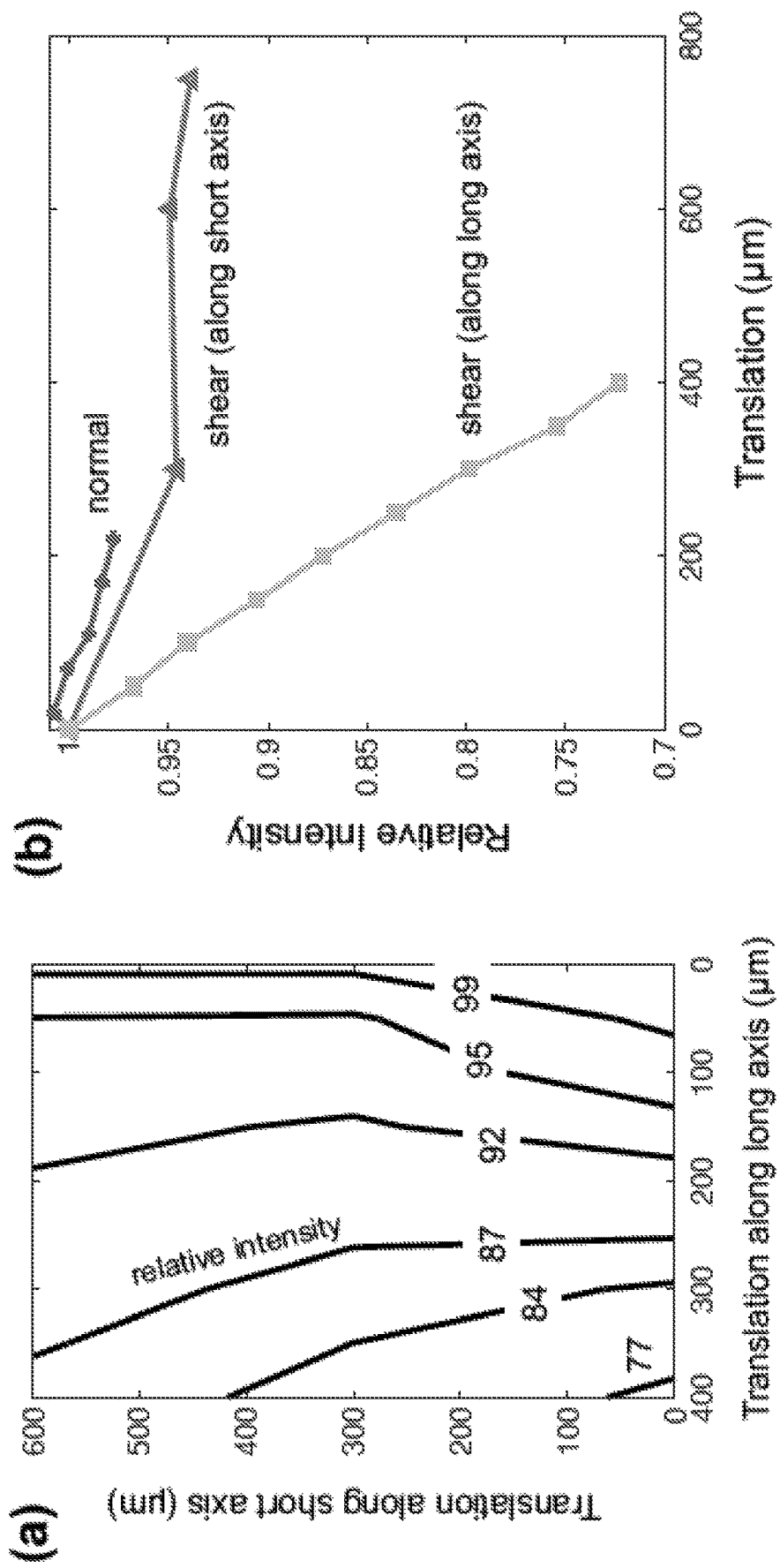

FIG. 6 presents two plots showing relative intensity levels exhibited by a nanopillar-based force sensor in accordance with one example.

Figure 7:
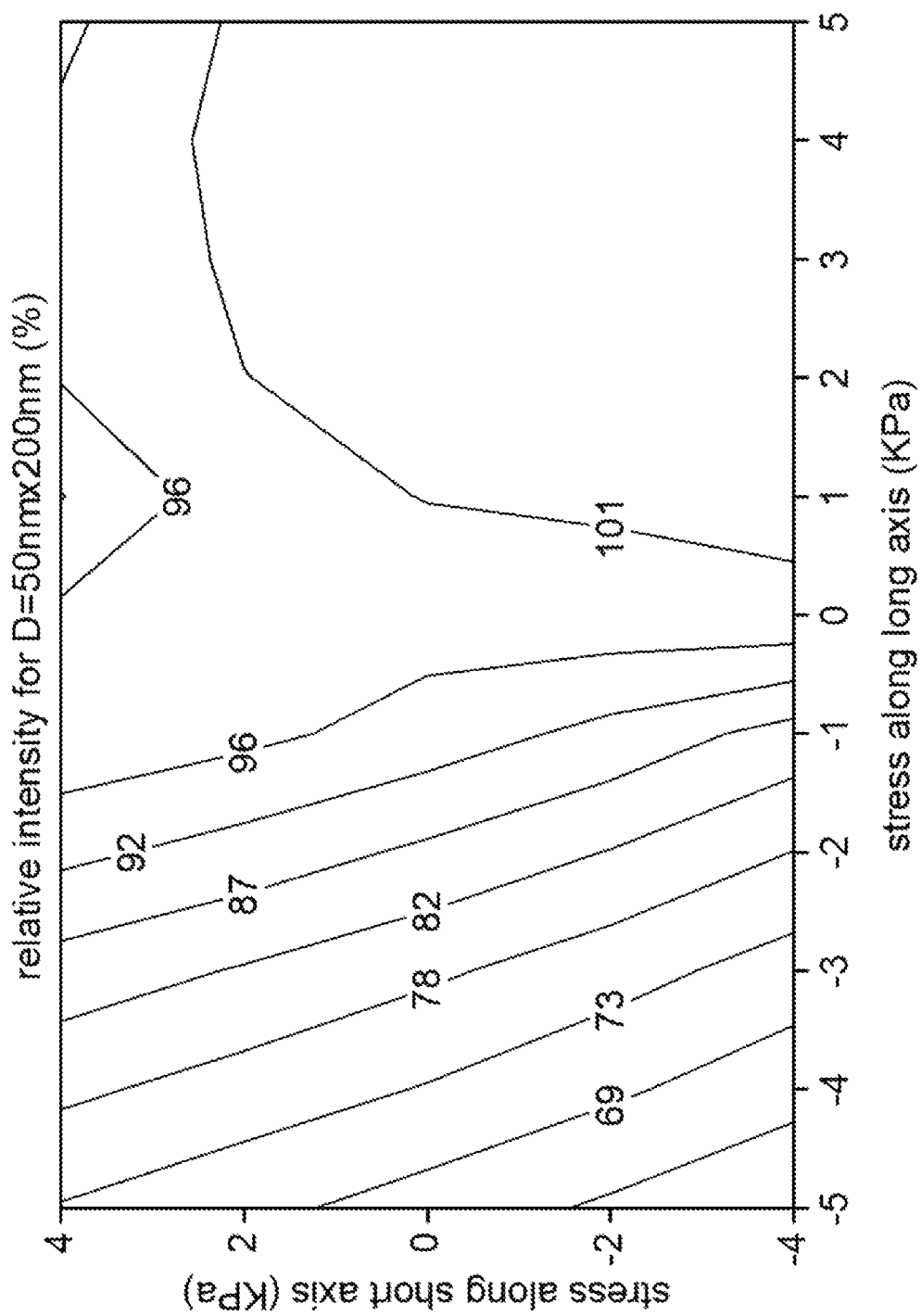

FIG. 7 is a plot showing relative intensity levels exhibited by a nanopillar-based force sensor in accordance with another example.

Figure 8:
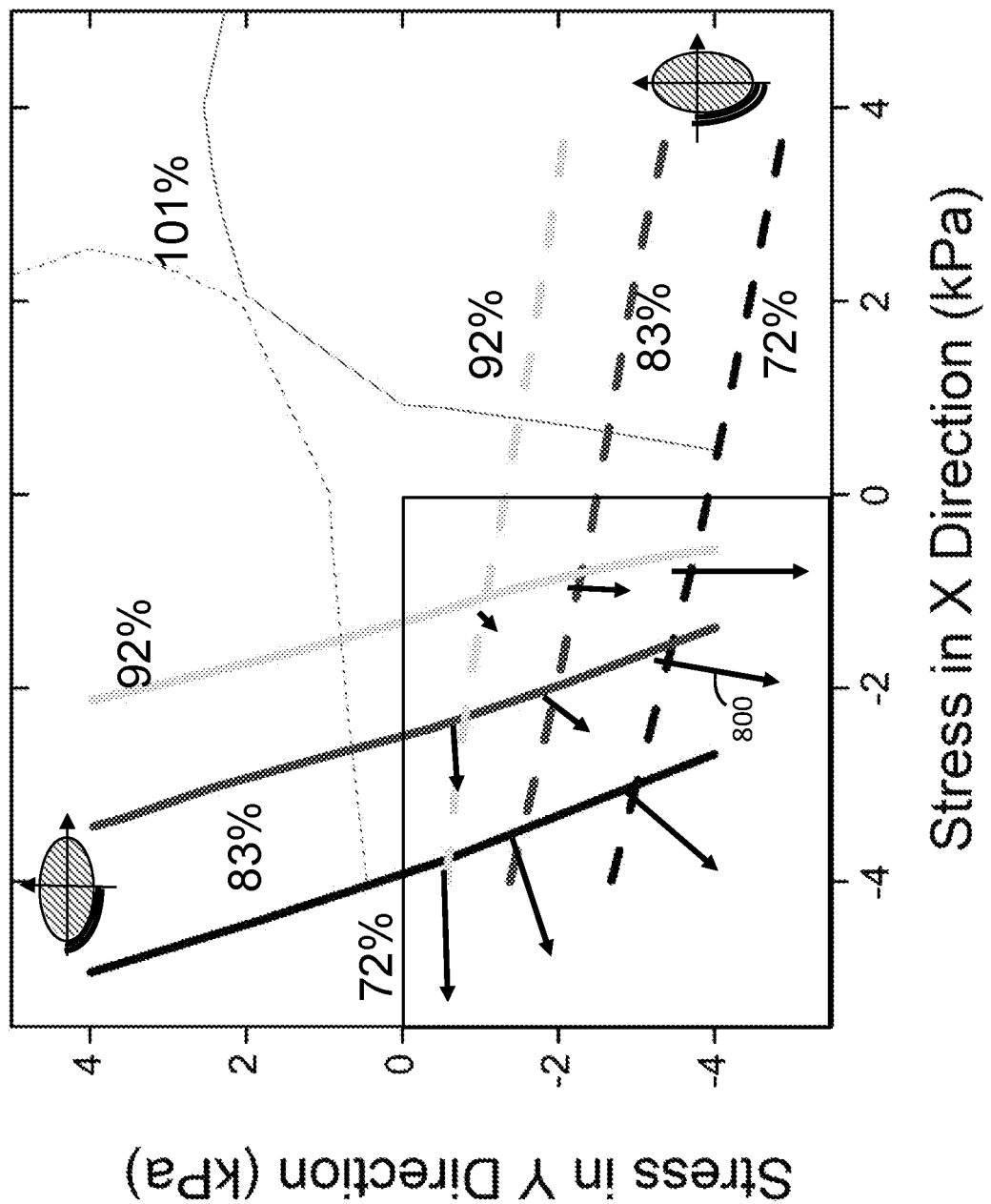

FIG. 8 is a plot showing relative intensity levels exhibited by a nanopillar-based force sensor in accordance with one example for shear stresses applied to the force sensor in two directions.

The embodiments of the disclosed devices may assume various forms. Specific embodiments are illustrated in the drawing and hereafter described with the understanding that the disclosure is intended to be illustrative. The disclosure is not intended to limit the invention to the specific embodiments described and illustrated herein.

DETAILED DESCRIPTION OF THE DISCLOSURE

Light-based tactile sensing devices are described. The disclosed devices measure shear stress (e.g., a force in a direction parallel to the sensor array) as tensorial tactile sensing devices. The shear stress is measured by detecting variations in light emitted from an array or other set of light emitting force sensors. Each force sensor includes a stack of semiconductor layers, which may be arranged in one or more nano-scale structures (or nanostructures). The nanostructures may be configured as light emitting diodes (LEDs). A nano-LED mechanoreceptor is thus realized. Both the magnitude and direction of the shear stress are determined from the detected variations. In some cases, each nanostructure is or includes a GaN-based heterostructure stack or pillar. Other heretostructures and semiconductor materials may be used.

The directional sensitivity of the disclosed devices is provided by asymmetrical aspects of the array or set of force sensors. The use of heterostructures (or other semiconductor stacks) provides multiple degrees of freedom for deviation from symmetry. For instance, deviating from the spatial symmetry of the heterostructure in all three directions embeds the directional sensitivity directly into the optical properties of the heterostructure. In some cases, each heterostructure may include an elliptical or other heterostructure pillar having an elongated cross-section. The orientation of an axis along which the pillar is elongated provides directional information. Further directional information to distinguish between directions along the axis is provided by varying a position of an electrode or other post of the force sensors. Each pixel of the disclosed devices may include a set of multiple nanopillars with these varying characteristics. For instance, the disclosed devices may include four orthogonally oriented elliptical nanopillars with electrodes disposed in respective locations on sidewalls of the nanopillars to determine both the direction and magnitude of the external force parallel to the sensor (e.g., a shear force). Different combinations of nanopillars are sensitive to the force in different directions. Thus, the direction may be determined by detecting which nanopillar combination experiences a variation in light emission.

Several aspects of the disclosed devices are well suited for scaling. For instance, the array of force sensors may use a common bias. Two-dimensional mapping of the shear stress is thus not made undesirably complex by the size of the array. As another example, the stress sensing relies on differential or relative measurements. As a result, the force sensors need not be strictly uniform. Size, shape, illumination, and other characteristics of the force sensors may vary across the sensor array without undesirable effects on the sensing. The variations in light emitted by the array may be captured by an off-the-shelf or other commercially available imager or imaging device.

Figure 1:
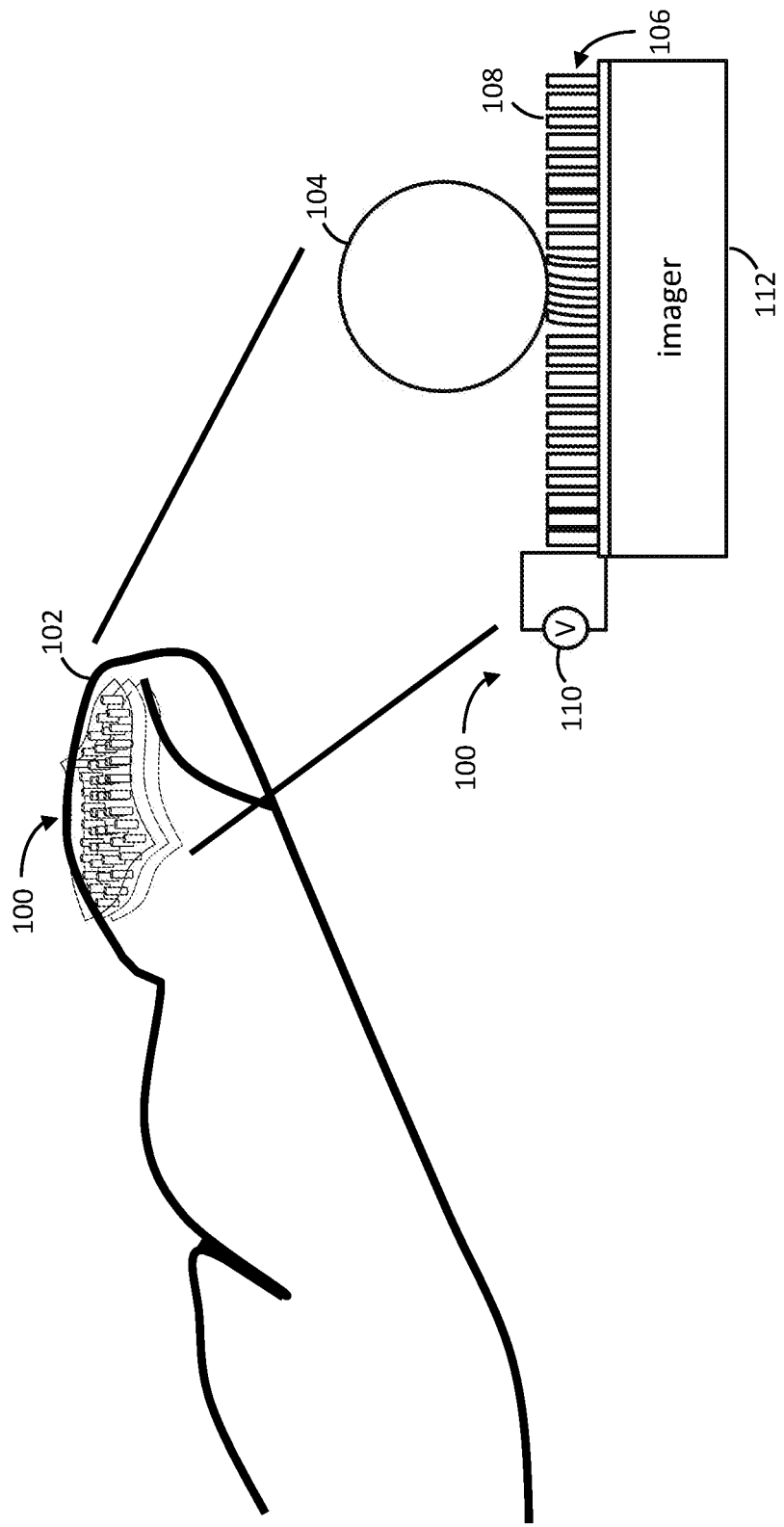
FIG. 1 is a schematic, perspective and side views of a tactile sensor device in accordance with one example.

Turning to the drawing figures, FIG. 1 depicts a device 100 configured for use as a tactile sensor device in accordance with one example. In this case, the device 100 is disposed along a fingertip 102. The fingertip 102 may be a prosthetic hand, robotic hand, or other hand or finger. In this example, the device 100 is used to measure a shear force applied to the fingertip by an object 104. Although described in connection with a fingertip and tactile sensing applications, the device 100 is well suited for use in other applications and contexts. For instance, the device 100 may be used in other contexts in which shear forces are measured, such as measuring turbulent flows in fluids.

The device 100 includes an array 106 of force sensors 108. In this example, the force sensors 108 are subjected to the shear force applied by the object 104 as shown. Each force sensor 108 includes a pillar that emits light upon application of a bias voltage 110. In this example, the bias voltage 110 is applied across the entire array 106. Individual and other bias schemes may be used in other cases. The intensity of the light emitted by each force sensor 108 changes (e.g., decreases) as the application of force (e.g., shear force) bends respective force sensors 108 of the array 106. In the example shown, several of the force sensors 108 are being bent by the object 104.

The array 106 may be a pixelated array. Each pixel provides the magnitude and direction of the applied force for a respective position (e.g., x, y coordinate) of the array 106 or, more generally, the device 100 or the fingertip 102. The force sensors 108 may be arranged in a pattern to establish the pixels of the device 100. For instance, each pixel of the device 100 may include a set (or subset) of the force sensors 108. In one example, a set of four of the force sensors 108 are grouped together in a diamond pattern to form a pixel of the array 106. Greater or fewer numbers of force sensors 108 may be used in a variety of patterns (e.g., tiled patterns) in other cases.

The light emitted by the force sensors 108 is captured by one or more imagers 112. In this case, the imager 112 extends across the array 106 to capture the light from all of the force sensors 108. The imager 112 may include a plurality of light detectors disposed relative to the force sensors 108 to receive the light emitted therefrom. Any number of light detecting elements may be used in any arrangement. The imager 112 may be or include an off-the-shelf light detector, such as a CMOS imager, a CCD imager, and an organic photodiode array.

In one example, each force sensor 108 in the array 106 has lateral dimensions of about 63 nanometers (nm) by about 165 nm, and a height of about 250 nm. But the dimensions of the force sensors 108 may vary considerably, as larger or smaller force sensors may be used. As a result, the array 106 may have an array sensor density of $2.7 \times 10^9$ cm$^{-2}$. The array sensor density may also vary considerably. For instance, the array sensor density may vary in accordance with the amount of precision warranted for a particular application or use scenario.

Figure 2:
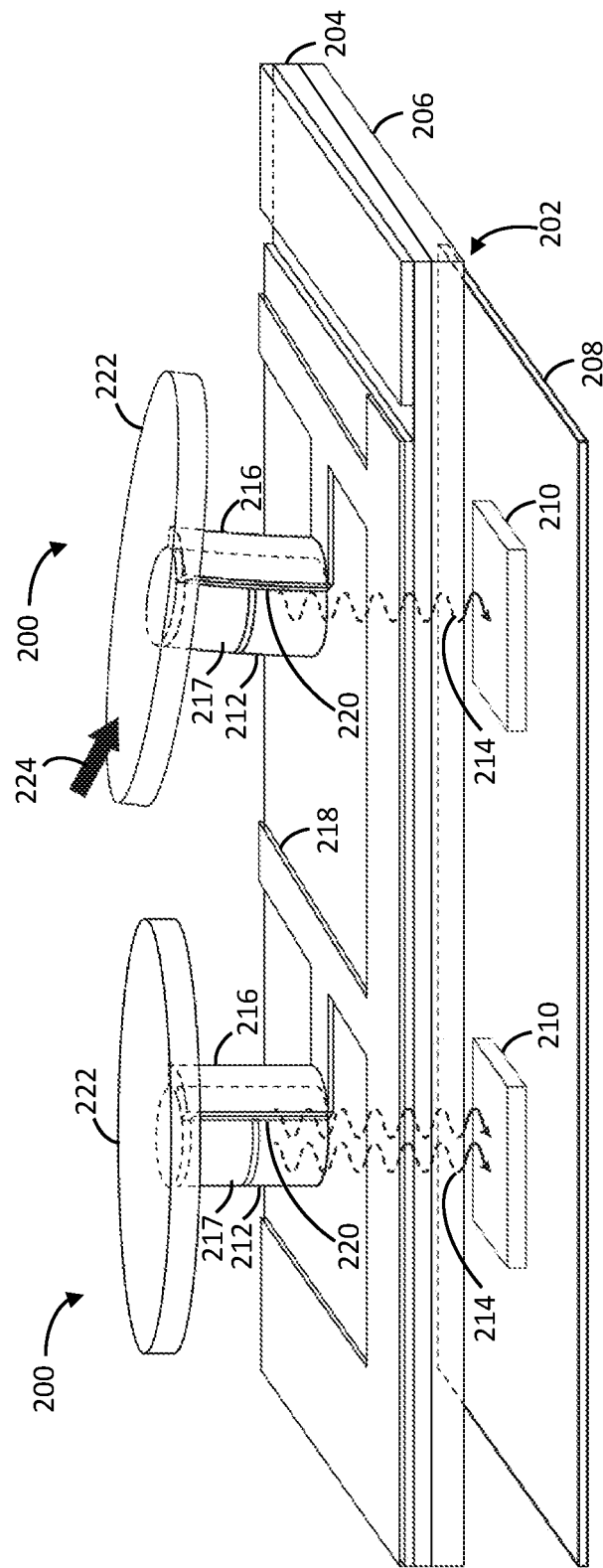
FIG. 2 is a schematic, perspective view of nanopillar-based force sensors of the tactile sensor device of FIG. 1 configured in accordance with one example.

FIG. 2 depicts a set of force sensors 200 in accordance with one example. Each force sensor 200 may correspond with one of the force sensors 108 of FIG. 1. The set of force sensors 200 may correspond with a pixel of a device array. For ease in illustration, the set includes a pair of force sensors 200, but any number of force sensors 200 may be included in a set, pixel, or other arrangement of force sensors 200.

The force sensors 200 are disposed on, or otherwise supported by, a substrate 202. The substrate 202 may or may not correspond with the substrate used during fabrication. In some cases, the fabrication substrate is or includes a sacrificial silicon substrate. The fabrication substrate is removed after structures of the force sensors 200 are epitaxially grown or formed thereon. In the example shown, the substrate 202 includes a number of transparent layers 204, 206. The layer 204 may be or include gallium nitride (GaN). The layer 206 may be or include GaN, sapphire, glass, or other transparent substrates.

The substrate 202 may also include one or more layers or structures of a light detecting imager 208. The imager 208 may provide some or all of the imager 112 of FIG. 1. The imager 208 may support the force sensors 200 and, thus, effectively act as the substrate 202. The imager 208 is depicted in FIG. 2 as spaced from the layers 204, 206 for ease in illustration. The imager 208 may include any number of light detectors or other light-sensitive elements 210, which may or may not be aligned with the force sensors 200 as shown. The nature, components, materials, constituent layers, and other characteristics of the substrate 202 may vary from the example shown.

Each force sensor 200 includes a pillar 212 (e.g., a nanopillar) extending outward from the substrate 202. Each pillar 212 is or includes a stack of semiconductor layers configured to emit light, e.g., as a light emitting diode (LED). The layers of the stack may be epitaxially grown. For example, the pillar 212 may be fabricated as an epitaxial stack on (111) Silicon grown by metal-organic chemical vapor deposition. The pillar 212 may be configured as a heterostructure. In some cases, the heterostructure includes GaN-based semiconductor layers, such as InGaN and other GaN-related alloys, to form a GaN LED having one or more quantum wells (e.g., InGaN quantum wells). Other semiconductor materials with nonzero piezoelectric constants (e.g., other Group II-VI semiconductors) may be used in one or more layers of the stack.

The heterostructure or other stack of semiconductor layers is configured to emit light 214 upon application of a bias voltage (or other bias, such as an optical bias via, e.g., a vertically stacked LED at a shorter wavelength) across (or to) the stack of semiconductor layers. The light emission wavelength from each pillar 212 may be determined by the thickness and/or alloy compositional profiles of the quantum well(s) (e.g., InGaN quantum well(s)).

Each force sensor 200 includes a post 216. The post 216 is disposed along only a portion of a perimeter of the pillar 212. As a result, the pillar 212 and the post 216, taken together (e.g., as a composite structure), have an asymmetrical cross-sectional shape. The force sensor 200 thus has an asymmetrical cross-sectional shape when taken along a line intersecting the pillar 212 and the post 216.

In the example of FIG. 2, the post 216 is or includes an electrode 216. The bias voltage is applied to each pillar 212 by the electrode 216. The electrode 216 may include one or more metal layers for purposes other than conduction, including, for instance, adhesion. For example, the electrode 216 may include nickel and gold layers. In this case, the electrode 216 extends the entire height of the pillar 212 up from a metal line, interconnect, trace, or other conductor 218 along the substrate 202 to a contact at an outer end, or top, of the pillar 212. The contact may be a p-type contact of the heterostructure stack. The stack of semiconductor layers of the pillar 212 may include a p-type region 217 to which the electrode 216 is electrically connected. In other bias schemes, such as an optical bias scheme, the post 216 may be electrically inactive. For example, the post 216 may be or include a dielectric structure.

The electrode 216 is connected to the p-type contact without shorting the respective layers of the heterostructure or other stack. To that end, an insulating shell 220 is disposed between the electrode 216 and the pillar 212. For example, the insulating shell 220 may be or include Silicon nitride (SiN) and silicon dioxide ($SiO_2$).

In the example of FIG. 2, each force sensor 200 includes a top platform 222 spaced from the substrate 202 and supported by the pillar 212. The platform 222 may also be supported by the post 216. The top platform 222 may be shaped as a mushroom top structure for amplification (e.g., hydraulic amplification) of the force applied to the sensor 200. In some cases, the platform 222 is composed of, or otherwise includes, chromium, but other materials may be used. In one example, the dimensions of the platform 222 are about 95 nm by about 230 nm, leading to a hydraulic amplification factor of about 2. The dimensions may vary.

The fabrication of the light-emitting pillars may include one or more aspects of the procedures described in U.S. Patent Publication No. 2018/0332677 ("Color mixing monolithically integrated light-emitting diode pixels") and/or Teng et al., "Strain-induced red-green-blue wavelength tuning in InGaN quantum wells," Appl. Phys. Lett., 108, 071104 (2016), the entire disclosures of which are hereby incorporated by reference, and/or other procedures. An example fabrication sequence for the force sensors 200 includes patterning the pillars 212, forming the electrical contacts 216 (e.g., using angle deposition), planarizing the sample with a sacrificial layer, depositing and patterning the mushroom top or other platform 222, and then removing the sacrificial layer.

In operation, when the mushroom top or other platform 222 is subjected to an external force 224 (e.g., a shear force), the in-plane electric potential profile in the InGaN or other quantum wells (QWs) is modified. The modification leads to a variation in emission intensity (e.g., a decrease in intensity), which is detected by the imager 208. The variation is indicative of the magnitude of the external force. In most cases, the emission intensity decreases as the shear force increases.

As described herein, the variation in emission intensity is also indicative of the direction of the shear force. To that end, the spatial symmetry of the InGaN or other quantum wells may be broken in all three directions to render the light intensity sensitive to the direction of the applied force. The degree of the intensity change is sensitive to the direction of the force. As described herein, only the relative change of the emission intensity of the individual nanopillars, not the absolute intensity, is used for sensing. Also, use of a separate imager for detection eliminates the need for a complex electrical interconnect for the GaN or other heterostructure or other semiconductor stack. For at least these reasons, the force sensors of the disclosed devices achieve a good tolerance for any non-uniformity across either the light emitting elements or the imager.

Figure 3:
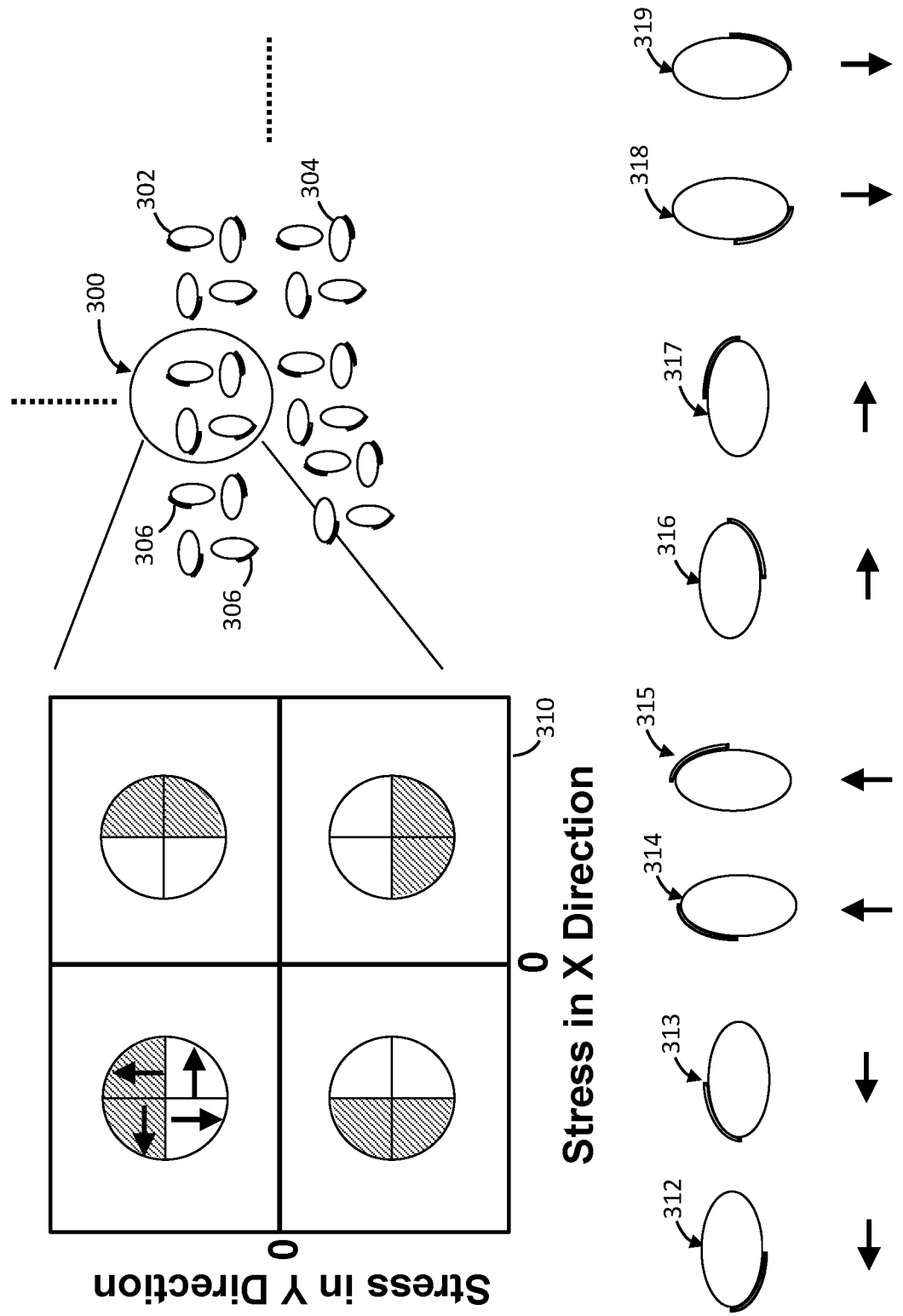
FIG. 3 is a schematic diagram of electrode positions of force sensors of a tactile sensor device in accordance with one example.

FIG. 3 depicts the asymmetrical aspects of a set 300 of force sensors 302 in accordance with one example. Each set 300 may correspond with, or be considered, a single pixel of a force sensor array. In this case, each set 300 includes four force sensors 302. Each force sensor 302 has a pillar 304 with a cross-section elongated along an axis. In the example of FIG. 3, each pillar 304 has a cross-section of an elliptical shape, such that the axis is a major axis of the elliptical shape.

The direction of the shear stress may be detected using the elliptically shaped pillars 304. The potential profile in an elliptical pillar is asymmetric under no external stress. The electrons and holes are confined more strongly along the short axis direction. As a result, the change of the emission intensity under an external stress is expected to be more significant if the stress is along the long axis direction. The orientation of the axis is thus one way in which the variation in light intensity is indicative of force direction.

In the example of FIG. 3, each respective set 300 of force sensors 302 includes two pairs of sensors having the axis oriented along two different directions. In this case, the two directions are orthogonal to one another. In other cases, the orientation of the axis may vary between more than two directions, any two of which may or may not be orthogonal to one another.

The number of force sensors 302 in each set 300 may vary. Additional, fewer, or alternative force sensor orientations may be used. For instance, each set 300 may include an additional elliptical force sensors having their major axes oriented at a 45 degree angle relative to the orientations of the force sensors 302.

The orientation of the axis allows the variation in light intensity to be indicative of the force along that axis. Further asymmetry is used to determine in which of the two directions along that axis the force is directed. For instance, the further asymmetry determines whether the force is directed to the left or to the right for an axis oriented laterally.

As shown in FIG. 3, the further asymmetry involves a peripheral (e.g., circumferential) position of a post 306 along the pillar 304. In this case, the post is or includes an electrode 306 along the pillar 304. The peripheral position of the portion of the perimeter at which the post 306 is disposed differs across the set 300 of force sensors 302 such that a variation in light emitted by the stack of semiconductor layers is indicative of a direction of a shear force applied to the set of force sensors. In the example of FIG. 3, each pair of force sensors 302 has the electrode 306 disposed on different circumferential sections of the pillar 304. As a result, the peripheral position varies between one of four discrete circumferential positions in this case. Each circumferential position may be disposed along a respective quadrant of the elliptical shape. The four quadrants may vary from the example shown. For instance, the circumferential position may correspond with a different (e.g., opposite) quadrant as long as the positions in each set 300 remain distinctive of force direction. For example, the upper left and lower right pillars in the set 300 depicted in FIG. 3 may be swapped.

The extent to which each electrode 306 covers a respective quadrant may vary from the example shown. For example, the electrode may not cover the entire quadrant in some cases.

Upon application of a shear force, the emission intensity from each force sensor 302 changes. The relative amount of the intensity change for each force sensor 302 is used to determine the direction of the applied force. The intensity changes (e.g., decreases) the most when the shear force is oriented in a direction (i) along a major axis of the pillar, and (ii) that attempts to move the pillar toward the electrode or other post. The intensity decrease is thus greater when the post is positioned closer to the side being compressed, rather than the side being stretched. The intensity is generally decreased as a result of movement of electrons within the heterostructure (e.g., GaN heterostructure). As the heterostructure is subjected to strain, the electrons tend to move toward the stretched side of the heterostructure (e.g., GaN heterostructure). The intensity decrease is therefore greater when the post is on (or nearer) the compressed side because the electrons are capable of moving further outward (within the composite structure of the heterostructure (e.g., GaN heterostructure) and the post) than when the post is on the stretched side and the electrons cannot move outward into the post. In this way, simultaneous measurements of intensities from multiple (e.g., two) pillars oriented in multiple (e.g., two) different directions, e.g. orthogonal to each other, allow the determination of the direction and magnitude of the force.

FIG. 3 depicts an example of how the intensities of the four pillars are used to determine force direction. The direction of force (e.g., shear stress) corresponding to the biggest intensity change (e.g., reduction) for each pillar 302 in the set 300 depicted in FIG. 3 is indicated by a respective arrow in a lookup table 310. So if the force direction is in the negative X-direction (with X, Y being the horizontal and vertical directions when looking down the pillars), then the pillar 302 in the upper-left-hand corner of the set 300 exhibits the biggest intensity change. If the force direction is in the positive X-direction, then the pillar 302 in the lower-right-hand corner of the set 300 exhibits the biggest intensity change. Forces in the positive and negative Y-directions will have the upper-right-hand and lower-left-hand pillars 302 exhibit the biggest intensity change, respectively.

The responses from the pillars 302 in the set 300 may also be used to address forces not aligned with one of the X- and Y-axes. The intensity changes from a subset of the pillars 302 are indicative of the force direction. The subsets for particular directions are indicated by shading in the lookup table 310. For example, if the direction of force (e.g., shear stress) is oriented on a 45 degree angle between the negative X and negative Y directions, then the two left-hand side pillars 302 in the set 300 are used. The lookup table 310 accordingly has the two left-hand-side quadrants shaded for the negative X/negative Y portion of the lookup table 310. As another example, the two lower pillars 302 of the set 300 are used if the force has components in the positive X direction and the negative Y direction, as shown in the lower right quadrant of the lookup table 310.

FIG. 3 also depicts a set of example pillar-electrode arrangements 312-319 with arrows indicating the direction in which the intensity decrease is maximized for each arrangement. The examples depict how two different arrangements provide a maximum decrease for each direction.

In other cases, the pillars (e.g., GaN nanopillars) may be biased optically. For example, the optical bias may be provided using a vertically stacked LED, e.g., at a shorter wavelength. To differentiate the direction of force in two opposite directions along the long axis when looking down the pillar, the peripheral (e.g., circumferential) position of a post (rather than an electrode) may still be used. In this case, dielectric and/or other non-metallic materials, such as SiN, may be used to form the post.

Figure 4:
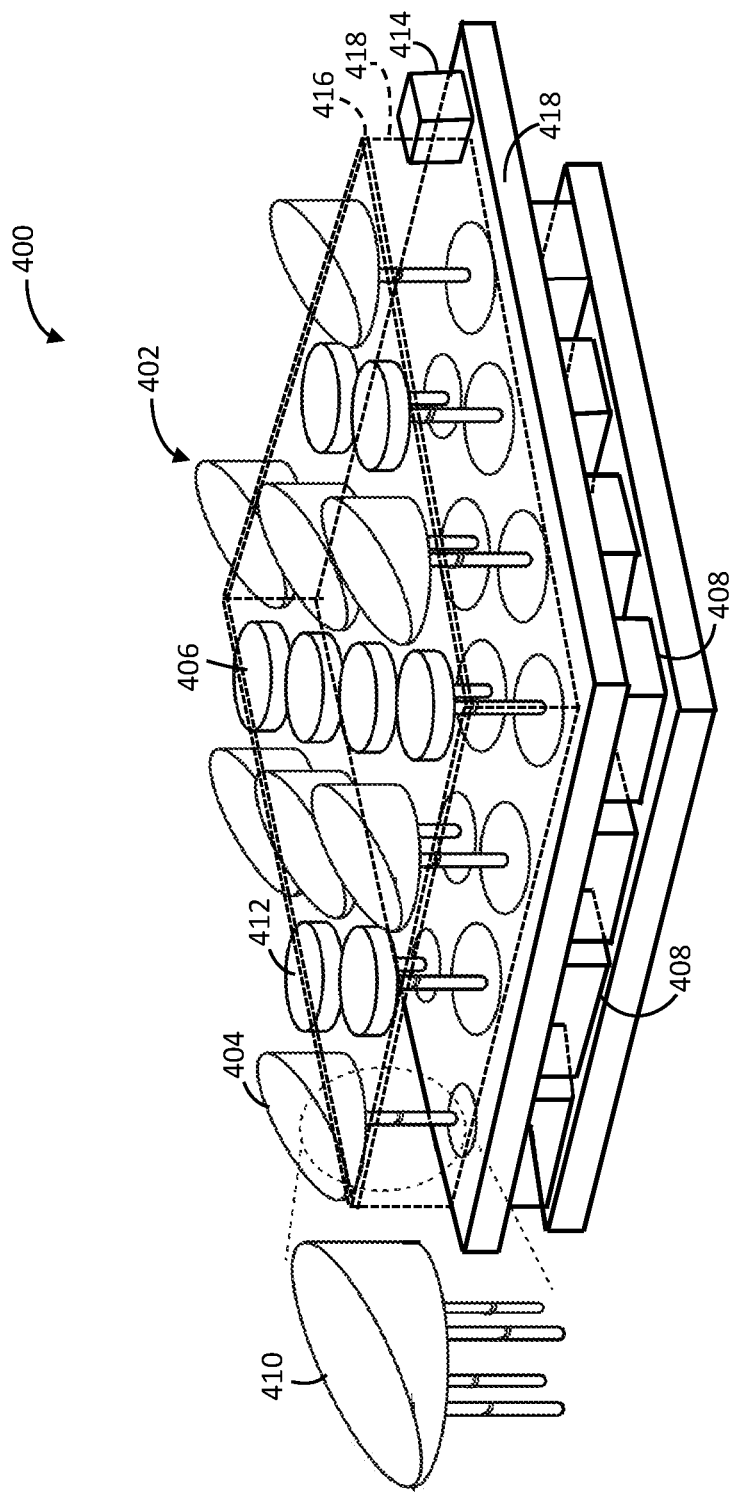
FIG. 4 is a schematic perspective view of a tactile sensor device having nanopillar-based force sensors configured for normal force detection in accordance with one example.

FIG. 4 depicts a device 400 having an array 402 of force sensors 404, 406 in accordance with another example. The configuration, fabrication, operation, and other characteristics of the device 400 may be similar in many respects to the devices described above. For instance, the device 400 includes one or more imagers 408 (e.g., silicon imagers) for detecting variations in the emissions from the force sensors 404, 406. The array 402 may be arranged to provide a number of pixels of the device 400. Each pixel includes multiple force sensors 404, 406, i.e., a set or group of force sensors. Within each group, the force sensors 404, 406 differ from one another to provide directional sensitivity. In this case, the force sensors 404, 406 differ from one another in ways other than (or in addition to) the orientation of the elliptical shape or the electrode location. The force sensors 404, 406 differ from one another in connection with the shape of the top platform. In this example, the force sensors 404 have a wedge-shaped top platform 410. In contrast, the force sensors 406 have a circular top platform 412.

The differently shaped platforms 410, 412 may be incorporated into the array 402 (or another array described herein) to provide further signal differentiation and, thus, further directional or force sensitivity. For instance, the wedge shape disposes an upper surface of the top platform 410 at an angle such that a normal force (normal to the substrate) applied thereto is detectable. The angled surface transforms the normal force into a shear stress upon the pillars of the force sensors 404. The force sensors 406 with the circular platforms 412 may be used to provide further information regarding force magnitude. Other non-planar and asymmetric platform shapes may be used.

The device 400 includes contacts 414, 416 for biasing the force sensors of the array 402. The contact 414 may be an n-type contact. The contact 416 may be a p-type contact. In this case, the contact 416 is disposed on an isolation layer 418. In this case, the isolation layer 418 is or includes an elastomer coating, such as PMMA.

Figure 5:
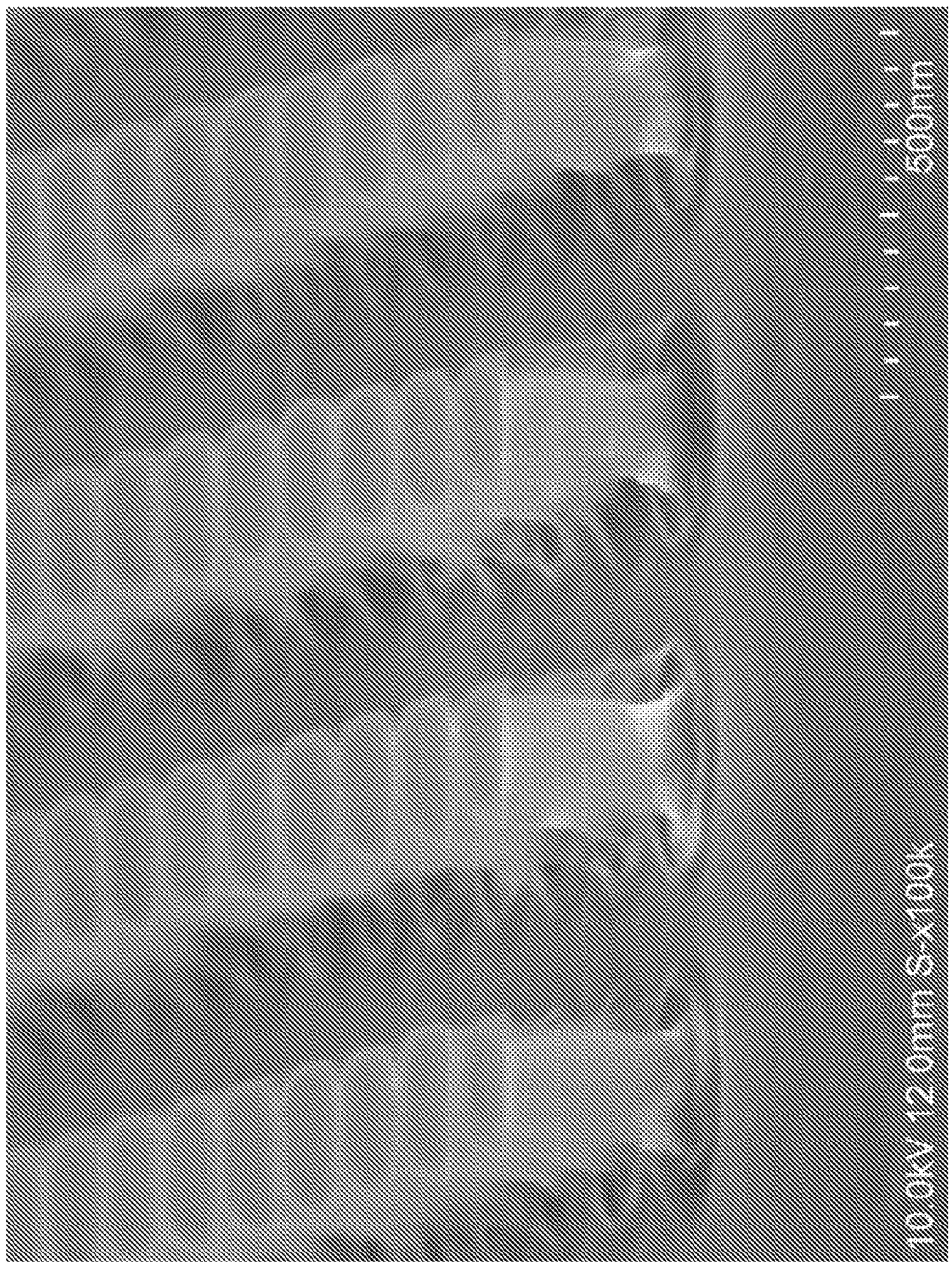
FIG. 5 is a scanning electron micrograph of an array of force sensors of a tactile sensor device in accordance with one example.

FIG. 5 shows a scanning electron micrograph of an example of an array of GaN-based nanopillar force sensors.

In this example, the emission wavelength of each force sensors was centered around 467 nm. The elliptical GaN nanopillars were fabricated using electron beam lithography and a two-stage dry and wet etching process.

FIGS. 6-8 show plots of relative emission intensity variations for a simulated and actual elliptical nanopillars (e.g., 50 nm by 200 nm elliptical nanopillar) in responding to a shear external stress in different directions. The electrodes are included in the simulations. In some cases, the top platforms were set to a diameter of 3 microns ($\mu$m) and centered around the underlying nanopillar although potential impact of misalignments to the results has also been assessed and shown to be minor as long as data from multiple pixels is used. Any effects from misalignment may be addressed (e.g., compensated) by relating the data from the multiple pixels.

FIGS. 6-8 show how the emission intensity is most sensitive to the shear stress along the long axis and only for the direction opposite to where the electrical contact (or electrode) or other post is located. This is because the outward movement of electrons is impeded by the position of the post, as described above. With this in mind, the disclosed devices may include multiple groups of elliptical nanopillars oriented in different directions, as described above.

The strain distribution of the above-described GaN nanopillars was calculated to validate the sensing technique of the disclosed devices. The strain distribution in the InGaN/GaN quantum well region was used to determine the electric potential profile. There are two sources of strain in the InGaN quantum well: the strain caused by the external stress and the residual strain caused by the lattice mismatch between InGaN and GaN. Once the electric potential profile was determined in and around the quantum well, the Schrödinger-Poisson equation was solved under the effective mass approximation. Multiple eigen-solutions for the conduction and valence bands were obtained. The excitonic effect was ignored, which is a reasonable approximation at room temperature. Finally, the matrix element was calculated to determine the emission intensity. The matrix elements from different electron and hole eigenstates were weighted by the Fermi-Dirac distribution, assuming a surface carrier concentration of $3 \times 10^{11}$ cm$_{-2}$ in the quantum well. Typically, hundreds of eigenstates were included in the calculation of the emission intensity. A temperature of 300K was assumed throughout the simulations although it is expected that the results are applicable for a different substrate temperature. Finally, in analyzing the results, the relative emission intensity change was focused on. The slight wavelength shift from the emission due to external stress may be ignored, as the filter passbands in off-the-shelf imagers are usually very broad and are not very sensitive to the slight wavelength shift. GaN nanopillars of different diameters and shapes (both circular and elliptical) were considered. The InGaN quantum well thickness was 3 nm with 18% indium composition, which provides an emission with a wavelength around 500 nm, a wavelength at which a typical silicon-based imager has excellent sensitivity. The SiN mushroom top has a circular geometry and a thickness of 400 nm, while the size is varied for optimizations.

FIG. 6 depicts measured data for the example of FIG. 5. The device included an array of elliptically-shaped GaN nanopillars with dimensions of 63 nm×165 nm, height of 250 nm, and an array density of 2.7×10$^9$ cm−2. On top of each nanopillar is a "mushroom top" structure made of chromium with dimensions of 95 nm×230 nm, corresponding to a hydraulic amplification factor of ~2. The sample was fabricated on a standard GaN blue-emitting LED epitaxial stack on (111) Silicon grown by metal-organic chemical vapor deposition. The emission wavelength was centered around 467 nm.

The stress was applied using a double-side polished sapphire substrate coated with photoresist (SPR220; 2.2 μm thickness) which functions as an elastomer. The stress was generated in the nanopillar array by moving the sapphire substrate using a 3-axis translation stage. When the photoresist layer was in contact with the nanopillar array, the movement of the translation stage generated stress in the photoresist layer which was then transferred to the nanopillar array. This is similar to the way a tactile sensor will likely be used. For simplicity, the nanopillars were biased optically using a 405 nm wavelength laser diode. The photoluminescence (PL) from the nanopillar array is collected by a spectrometer through the sapphire substrate and an optical fiber.

The PL spectra was compared with and without the photoresist layer to verify the PL was indeed from the nanopillar array instead of from the photoresist. Next, the translation stage was moved using three micrometers and recorded the positions on the micrometers. The stress applicator was first moved toward the sample until a change in the PL spectrum was observed. This position is considered the origin at which the PL intensity will be compared to. The other two directions were then varied, and the PL spectra was recorded. Plot (a) of FIG. 6 shows the relative PL intensity (calculated by integrating the area of each PL spectrum) at a fixed vertical position. It can be observed that the PL intensity only changes significantly when the stress is along the long axis of the ellipse which agrees with the theoretical results shown in FIG. 7. Because the sample has no electrical contact layer, the results should only be compared to the left-hand side of FIG. 7.

Plot (b) of FIG. 6 compares the relative PL intensity change when the translation stage is moved only in one direction. It can be seen that the PL intensity from the nanopillar is most sensitive to the stress applied along the long axis of the ellipse, confirming the functionality of the proposed sensor of detecting the shear stress of both its magnitude and direction.

FIG. 8 depicts further data for another example of a GaN-based tactile sensor device to depict how the intensity changes from multiple pillars may be considered to determine an arbitrary force direction (e.g., a direction not aligned with one of the axes). Several example force directions are indicated in the plot of FIG. 8 by arrows. The intensity changes for two pillars having electrodes in the lower left hand quadrant are shown. The two pillars are elliptically shaped and oriented as shown. For a force oriented in a direction 800, the intensity of the horizontally oriented pillar drops to a level of 83%. For the same force, the intensity of the vertically oriented pillar drops to a level of 72%. A lookup table may be used to correlate those two intensity changes with the direction 800.

Described above are examples of optical tactile shear stress sensors. By patterning a GaN LED chip into an array of nanopillars, the electron-hole wavefunction overlap in the InGaN QW plane can be changed according to the external stress, which in turn changes the emission intensity. As a result, monitoring the emission intensity using an imager can map out the stress distribution. The disclosed devices are thus sensitive to the shear stress. Moreover, using elliptically-shaped nanopillars, the direction of the stress can be identified. The disclosed devices use only a common optical or electrical bias across the entire array. All electric interconnects and circuits needed for a two-dimensional mapping of the stress lie within the imager. The alignment with the silicon imager is not critical. Placement of the imager directly underneath the GaN chip with the substrate removed minimizes beam divergence and allows a high sensor spatial resolution to be achieved.

For large area applications or ones that require flexibility, e.g. in an artificial skin, organic based imager may be a more suitable choice. As only the dynamic change of the emission intensity map is needed to detect the stress distribution, there is no need to perform a pre-calibration. It also enables a good tolerance to fabrication non-uniformity.

The impact of potential fabrication errors was also analyzed. For example, there is potential misalignment between the mushroom top and the underlying nanopillar if the top and pillar are patterned in two lithographic steps. An elliptical nanopillar structure was fabricated with the center of the mushroom top having a 100 nm misalignment along the long axis with respect to the underlying nanopillar. The misalignment may cause some ambiguity in differentiating the stress along the long axis and the stress along the short axis. Without any post-processing of the sensing result, the misalignment may thus reduce the usable sensing range. However, by correlating the data from multiple pixels, it is possible to compensate this effect.

The present disclosure has been described with reference to specific examples that are intended to be illustrative only and not to be limiting of the disclosure. Changes, additions and/or deletions may be made to the examples without departing from the spirit and scope of the disclosure.

The foregoing description is given for clearness of understanding only, and no unnecessary limitations should be understood therefrom.

What is claimed is:

1. A device comprising:
a substrate; and
a set of force sensors supported by the substrate, each force sensor of the set of force sensors comprising:
a pillar extending outward from the substrate, each pillar comprising a stack of semiconductor layers, the stack of semiconductor layers being configured to emit light upon biasing of the stack of semiconductor layers; and
a post disposed along only a portion of a perimeter of the pillar such that, taken together, the pillar and the post have an asymmetrical cross-sectional shape;
wherein each pillar has a cross-section elongated along an axis, and
wherein an orientation of the axis, and a peripheral position of the portion of the perimeter at which the post is disposed, differ across the set of force sensors such that a variation in light emitted by the stack of semiconductor layers of one or more of the force sensors of the set of force sensors is indicative of a direction of a shear force applied to the set of force sensors.

2. The device of claim 1, wherein the post is configured as an electrode to apply a bias voltage across the stack of semiconductor layers.

3. The device of claim 2, wherein the electrode is electrically connected to the stack of semiconductor layers at an outer end of the stack.

4. The device of claim 2, wherein the pillar comprises a p-type region to which the electrode is electrically connected.

5. The device of claim 2, wherein each force sensor further comprises a dielectric shell disposed between the stack of semiconductor layers and the electrode.

6. The device of claim 1, wherein the orientation of the axis varies between one of two orthogonal directions.

7. The device of claim 1, wherein the peripheral position varies between one of four discrete peripheral positions.

8. The device of claim 1, wherein the cross-section has an elliptical shape, such that the axis is a major axis of the elliptical shape.

9. The device of claim 8, wherein the peripheral position varies between one of four discrete peripheral positions, each peripheral position being disposed along a respective quadrant of the elliptical shape.

10. The device of claim 1, wherein each force sensor of the set of force sensors comprises a platform spaced from the substrate and supported by the pillar and the post.

11. The device of claim 1, wherein each stack of semiconductor layers comprises a GaN-based heterostructure.

12. The device of claim 1, wherein the substrate comprises an imager, the imager comprising a plurality of light detectors disposed relative to the set of force sensors to receive the light emitted from the set of force sensors.

13. The device of claim 1, further comprising an array of force sensors supported by the substrate, the array comprising a plurality of force sensor sets, wherein the set of force sensors corresponds with a respective set of the plurality of force sensor sets, each force sensor set of the plurality of force sensor sets forming a pixel of the array of force sensors.

14. The device of claim 1, wherein the variation in the light comprises an emission intensity variation indicative of the direction of the shear force.

15. The device of claim 14, wherein the emission intensity variation is an intensity decrease as the shear force increases.

16. The device of claim 1, wherein a common bias is applied to each force sensor of the set of force sensors.

* * * * *